United States Patent
Lu et al.

(10) Patent No.: US 8,170,822 B2
(45) Date of Patent: May 1, 2012

(54) COMPENSATION METHOD FOR TOUCH SENSOR SYSTEM

(75) Inventors: Ting-Yuan Lu, Kaohsiung (TW); Wen-Liang Liu, Hsinchu (TW); Cheng-Mu Wu, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 385 days.

(21) Appl. No.: 12/650,749

(22) Filed: Dec. 31, 2009

(65) Prior Publication Data

US 2010/0250180 A1     Sep. 30, 2010

(30) Foreign Application Priority Data

Mar. 25, 2009  (TW) ............................... 98109686 A
Aug. 25, 2009  (TW) ............................... 98128482 A

(51) Int. Cl.
   *G06F 11/00*    (2006.01)

(52) U.S. Cl. ........................................................ 702/71

(58) Field of Classification Search .................... 702/71, 702/150, 182–185
See application file for complete search history.

(56) References Cited

U.S. PATENT DOCUMENTS

2009/0225036 A1*  9/2009  Wright ......................... 345/173
* cited by examiner

*Primary Examiner* — Edward Raymond
(74) *Attorney, Agent, or Firm* — WPAT., P.C.; Justin King

(57) ABSTRACT

A compensation method devoid of operating voltage calibration, establishing fundamental linearity calibration table and inputting, and detecting the actual operating voltage is disclosed. The compensation method comprises the steps of: a) turning off a switch in a touch sensor system; b) initializing the touch sensor system and measuring a reference frequency outputted from a oscillator in the touch sensor system; c) turning on the switch and measuring a first frequency outputted from the oscillator; and d) deducting the first frequency from the reference frequency so as to obtain a frequency difference; and e) comparing the difference with a predetermined value, and judging based upon the difference if the touch sensor system is touched by a foreign object.

6 Claims, 10 Drawing Sheets

COMPENSATION METHOD FOR TOUCH SENSOR SYSTEM

BACKGROUND OF THE INVENTION

1. Field of the Invention

The present invention relates to a compensation method for a touch sensor system, more particularly, to a compensation method for a touch sensor system whose operating frequency is being affected.

2. Description of the Prior Arts

In a touch sensor system, various approaches are employed to detect a touch behavior thereof. One of them is as follows: Disposing an oscillator, which can sense the capacitance at its outside environment. While the capacitance varies, correspondingly, an oscillating frequency of the oscillator will also vary. Meanwhile, the touch sensor system can determine the touch behavior of a user based upon an oscillating frequency change. However, while an operating voltage of the touch sensor system varied, in the same manner, the oscillating frequency of the aforementioned oscillator will also be affected accordingly so as to mislead the touch sensor system to wrongly determine the user's behavior.

Suppose there exists an oscillator inside the touch sensor system. As known, the oscillator can sense the touch behavior of users. While they touch the panel, the oscillator can sense the external capacitance variation by means of lowering its outputted oscillating frequency, in such a manner, the touch sensor system can determine the touching action from the user according to the change of the oscillator frequency thereafter. The touch sensor system can function properly while the operating voltage $V_{DD}$ remains stable and constant. However, as aforementioned, while the operating voltage is varied, the oscillator can mislead the touch sensor system. For instance, as the operating voltage is descending, the oscillating frequency of the oscillator will be dropping accordingly. Meanwhile, since the touch sensor system determined the user's touching action up to the descending of the oscillating frequency, mistakenly, the users will be treated as touching the panel system.

R. O. C. Taiwan Patent No. I297857 discloses a linear compensation method for a touch sensor system. After the touch sensor system is calibrated according to a built rated operating voltage or setting operating voltage, at the time of installing inside an actual operating touch sensor system environment and inputting the actual operating voltage thereafter, the linear compensation method comprises a step of: renewing a linear compensation data based upon the voltage difference between the actual operating voltage and rated operating voltage/setting operating voltage so as to further ensure the touching field accuracy of actual operating voltage for a touch sensor system. However, inevitably, the method still comprise a step of calibrating the operating voltage set-up and building fundamental linearity calibrating data table and inputting/detecting the actual operating voltage.

Accordingly, in view of the above drawbacks, it is an imperative that a compensating method for a touch sensor system, particularly, a compensating method for a touch sensor system whose oscillating frequency is affected is designed so as to solve the drawbacks as the foregoing.

SUMMARY OF THE INVENTION

In view of the disadvantages of prior art, the primary object of the present invention relates to a compensation method of a touch sensor system, devoid of setting operating voltage calibration nor establishing fundamental linearity calibration data and inputting/detecting actual operating voltage, can achieve the compensation.

The present invention relates to a compensation method, comprising steps of:
(a) providing a touch sensor system having an oscillator and a switch for connecting an input pad outside the touch sensor system;
(b) closing the switch so as to measure a first frequency outputted from the oscillator;
(c) opening the switch and coupling a plurality of impedance elements by order at an output side of the oscillator so as to let a reference frequency outputted by the oscillator closest to the first frequency;
(d) closing the switch so as to measure a second frequency outputted from the oscillator;
(e) subtracting the reference frequency from the second frequency by a subtracting means so as to obtain a frequency difference; and then
(f) comparing the frequency difference with a specific value so as to judge if the touch sensor system being touched by an external object, after a while, go back to (d).

The present invention further relates to a compensation method, comprising steps of:
(a) providing a touch sensor system having at least a reference oscillator and a sensing oscillator;
(b) initializing the touch sensor system and measuring a reference frequency outputted from the reference oscillator;
(c) measuring a first frequency outputted from the sensing oscillator;
(d) respectfully coupling one output terminal of the reference oscillator to a plurality of impedance elements so as to let a reference frequency outputted by the oscillator closest to the first frequency;
(e) measuring a second frequency outputted by the sensing oscillator after a user specified period;
(f) subtracting the second frequency from the reference frequency so as to obtain a frequency difference by a subtracting means; and then
(g) comparing the frequency difference with a predetermined value so as to judge if the touch sensor system being touched by an external object, and after another user specified time go back to (e).

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

As the aforementioned stated, while the capacitive oscillator senses the external capacitance increment, the oscillating frequency thereof will descend, and, at the time of operating voltage dropping, the same will also descend. Alternatively, it is ambiguous that the oscillating frequency falling is actually caused either by the change of the capacitance or the change of the operating voltage.

Figure 1:
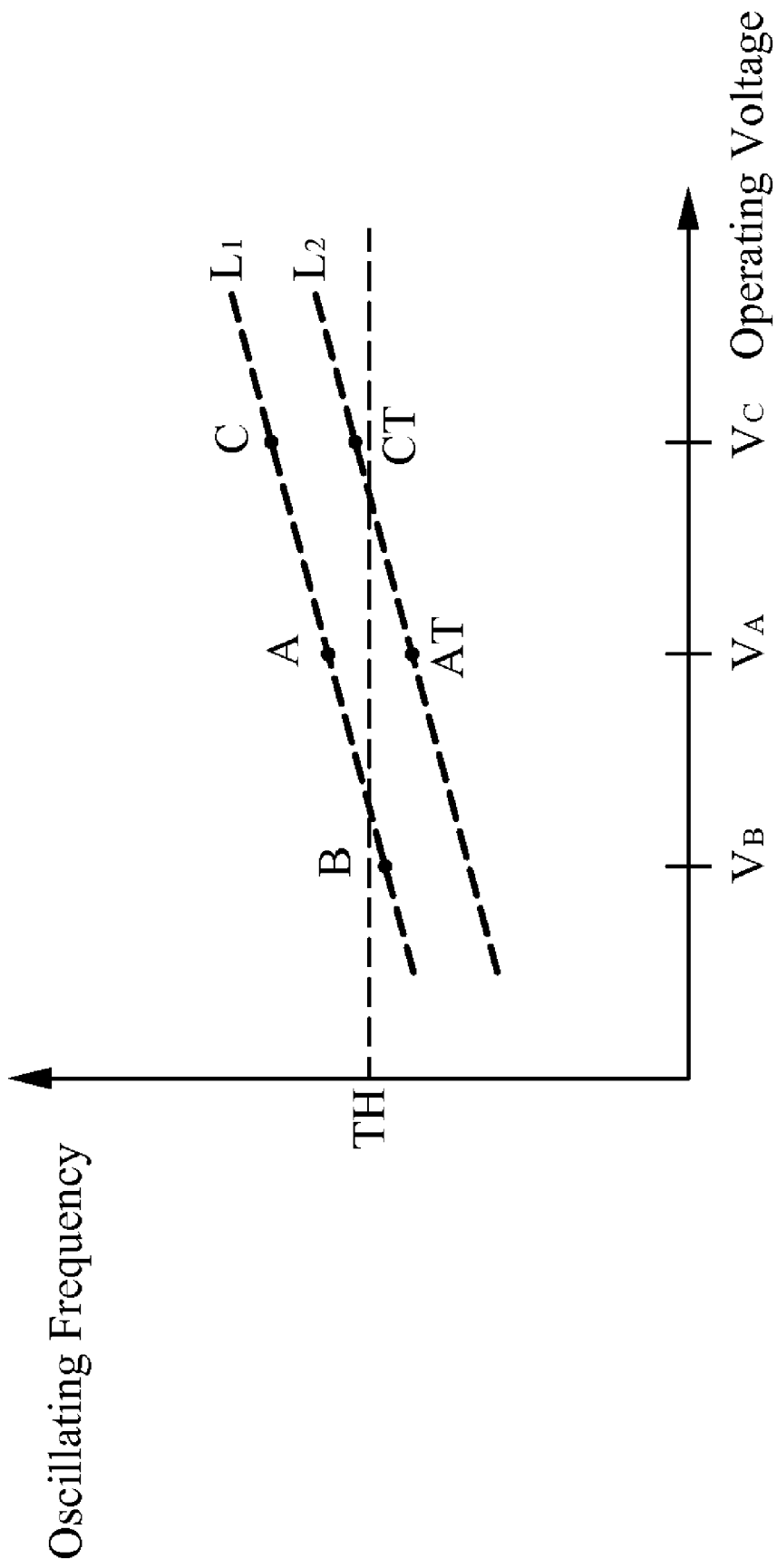
FIG. 1 is a diagram showing the relationship of the oscillating frequency vs. the operating voltage according to the oscillator in the present invention.

As FIG. 1 suggests, while nothing contacts the touch sensor system, the relationship of the oscillating frequency versus the operating voltage is denoted by $L_1$. Suppose that the operating voltage is fixed at a point such as $V_A$, and the outputted frequency by the oscillator is located at point A, then the touch sensor system uses TH as judging reference. If the oscillating frequency is lower than TH such as point B, then the system determines something already touches or approaches the system. Even though, the actual cause for that is because of the operating voltage reduction.

Furthermore, when the users touch the touch sensor system, due to the approach of the foreign object, accordingly, the induced capacitance will also be increasing. At the moment, the relationship of the oscillating frequency versus the operating voltage is denoted as $L_2$ in FIG. 1, where the outputted oscillating frequency for the oscillator is located at point AT. Because the oscillating frequency corresponding to AT is already lower than the boundary frequency TH for $L_2$, the touch sensor system determines there already exists a touch action.

However, as shown by $L_2$ in FIG. 1, when the user touches the touch sensor system but the operating voltage increases so as to move from the point AT to point CT, at the moment, the oscillating frequency thereof is already higher than that at TH, mistakenly, the touch sensor system will determine no touch action is taken.

Hence, to further address the issue, the determining approach for the touch sensor system is improved by using a reference frequency to eliminate an effect of the operating voltage on the touch sensor system during its variation.

Figure 2:
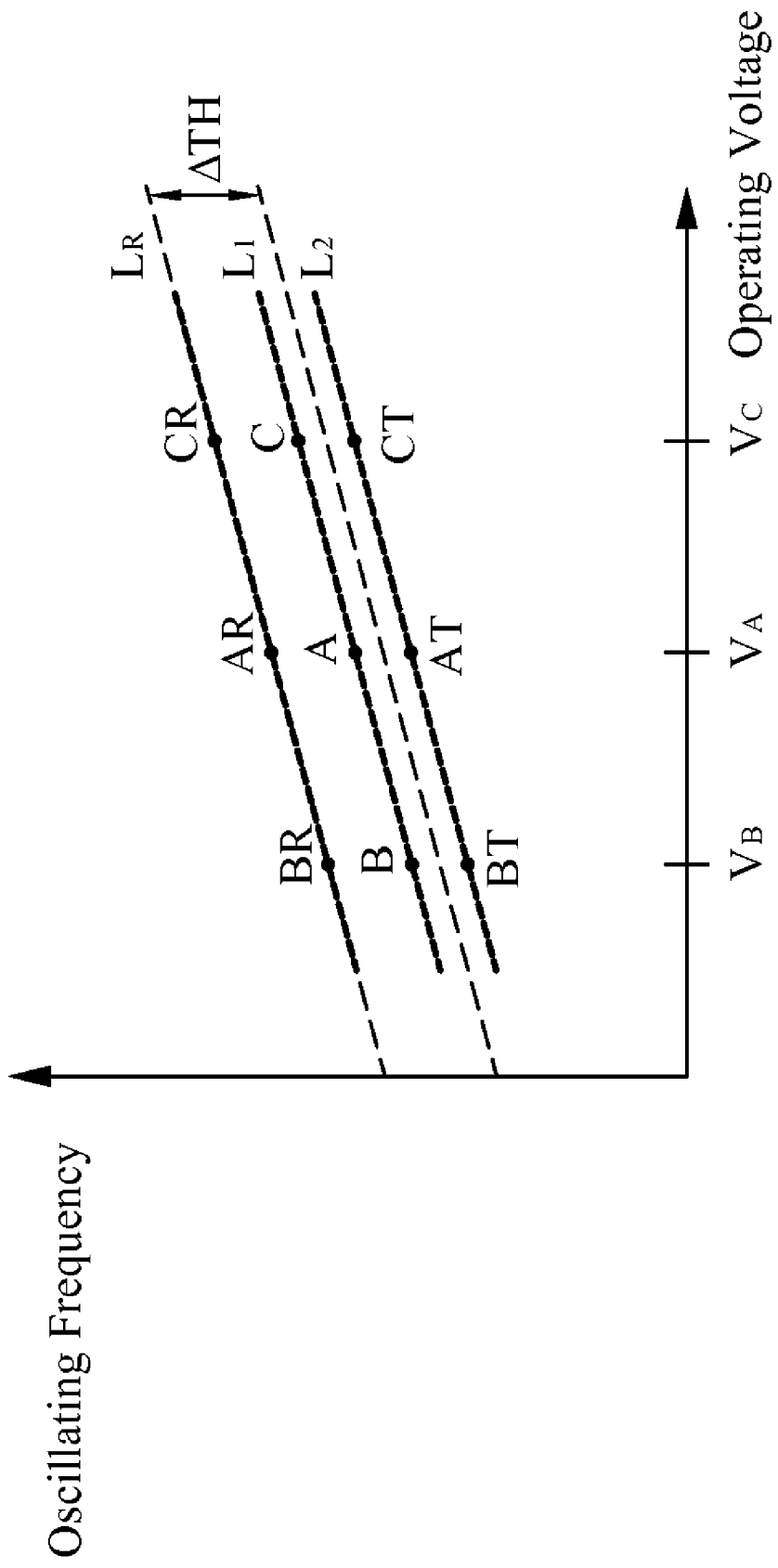
FIG. 2 is another diagram showing the relationship of the oscillating frequency vs. the operating voltage according to the oscillator in the present invention.

Turning up to FIG. 2 now, the relationship of the reference frequency versus the operating voltage for the reference oscillator is denoted as $L_R$ in FIG. 2. The relationship of the reference frequency versus the operating voltage for the sensing oscillator is denoted as $L_1$ where no one is touching the touch sensor. The relationship of the reference frequency versus the operating voltage for the sensing oscillator is denoted as $L_2$ where the user is touching the touch sensor. Before the operating voltage drops, a reference frequency of the reference oscillator is denoted as AR, later on, the external sensing capacitance is detected. Before the user touches the touch sensor system, suppose the frequency of the sensing oscillator is denoted as A, then the touch sensor system uses AR-A to detect whether there exits external sensing capacitance variation. Say, at the moment, AR-A is smaller than $\Delta_{TH}$, hence, it is treated as there is no external sensing capacitance increment. After the user touches the touch sensor system, the frequency for the sensing oscillator is denoted as AT, where the touch sensor system, in the same manner, applies AR-AT to determine if there is additional external sensing capacitance. At the moment, the value for AR-AT is larger than $\Delta_{TH}$, hence, it is be noted that there is external sensing capacitance increase, and the touch sensor system is treated as being touched or pressed. From FIG. 2, one skilled in the art can realized, the difference between AR and AT is approximately identical to the same between CR and CT and the same between BR and BT.

The skilled artisan can also apply the sensing oscillator to serve as the reference oscillator as well. At the moment, as $L_R$ and $L_1$ are concerned, at the time of the operating voltage change, the trend of frequency variation for $L_R$, and the same for $L_1$ are approximately aligned.

In case that the user does not touch the touch sensor system, if the operating voltage is dropping so as to lower the reference oscillating frequency of the oscillator from AR to BR, correspondingly, the oscillating frequency for the sensing oscillator, as not touched, drops from point A to point B. In the same manner, the touch system uses the difference between BR and B, namely, BR-B, to determine the existence of the external sensing capacitance. Since BR-B is smaller than $\Delta_{TH}$, the system determines there is no external sensing capacitance variation. In such a way, the conventional issue for mistakenly judging the user's behavior during voltage drifting for the conventional touch sensor system can be addressed. Apparently, BR-BT exceeds $\Delta_{TH}$, hence, the system determines that there exists external capacitance incremental. In the same manner, if the operating voltage is increasing so as to enhance the reference oscillating frequency from AR to CR, at the moment, the frequency for the oscillator without being touched increases from point A to C as well. Again, the touch sensor system uses the value of CR-C as a reference to determine the existence of the external capacitance variation. Apparently, CR-C is lower than $\Delta_{TH}$, hence, the system determines that there does not exist external capacitance variation. In the same manner, CR-CT is higher than $\Delta_{TH}$, hence, the system determines that there exists external capacitance variation. In such a way, the conventional touch sensor system no longer suffers from the voltage drifting and the user's behavior will not be mistakenly judged at the time of operating voltage drifting.

Figure 3:
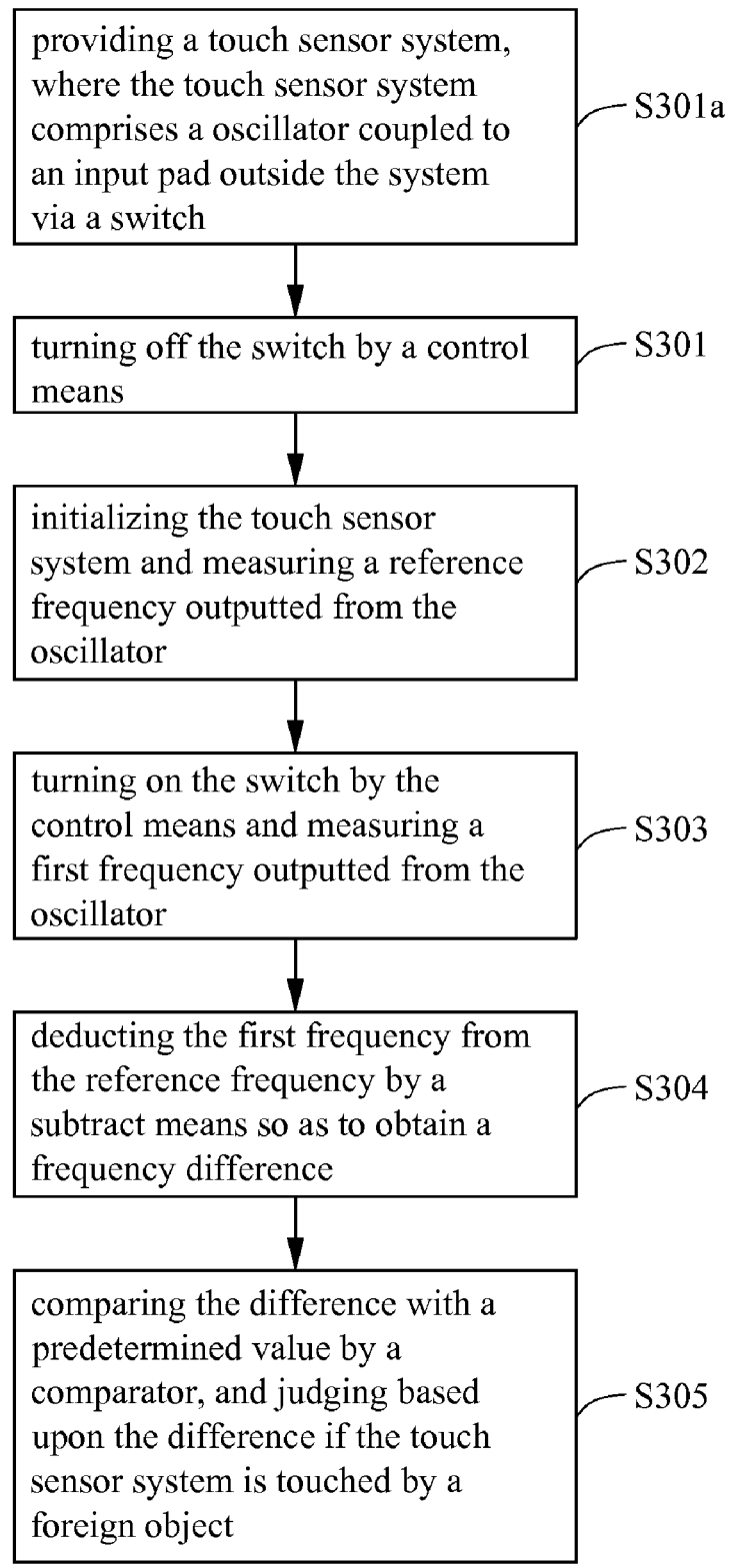
FIG. 3 is a flow chart for one of the methods disclosed in the present invention.

FIG. 3 illustrates a compensation method, said method comprises the steps of: s301a: providing a touch sensor system, where the touch sensor system comprises a oscillator coupled to an input pad outside the system via a switch; s301: turning off the switch by a control means; s302: initializing the touch sensor system and measuring a reference frequency outputted from the oscillator; s303: turning on the switch by the control means and measuring a first frequency outputted from the oscillator; s304: deducting the first frequency from the reference frequency by a subtract means so as to obtain a frequency difference; and s305: comparing the difference with a predetermined value by a comparator, and judging based upon the difference if the touch sensor system is touched by a foreign object.

Preferably, wherein said frequency can be replaced by a period.

Preferably, said method can be applied to eliminating an effect of temperature, humidity, process variation, and an operating voltage of the touch sensor system over the touch sensor system.

Preferably, said method can be done without an operating voltage calibration process.

Figure 4:
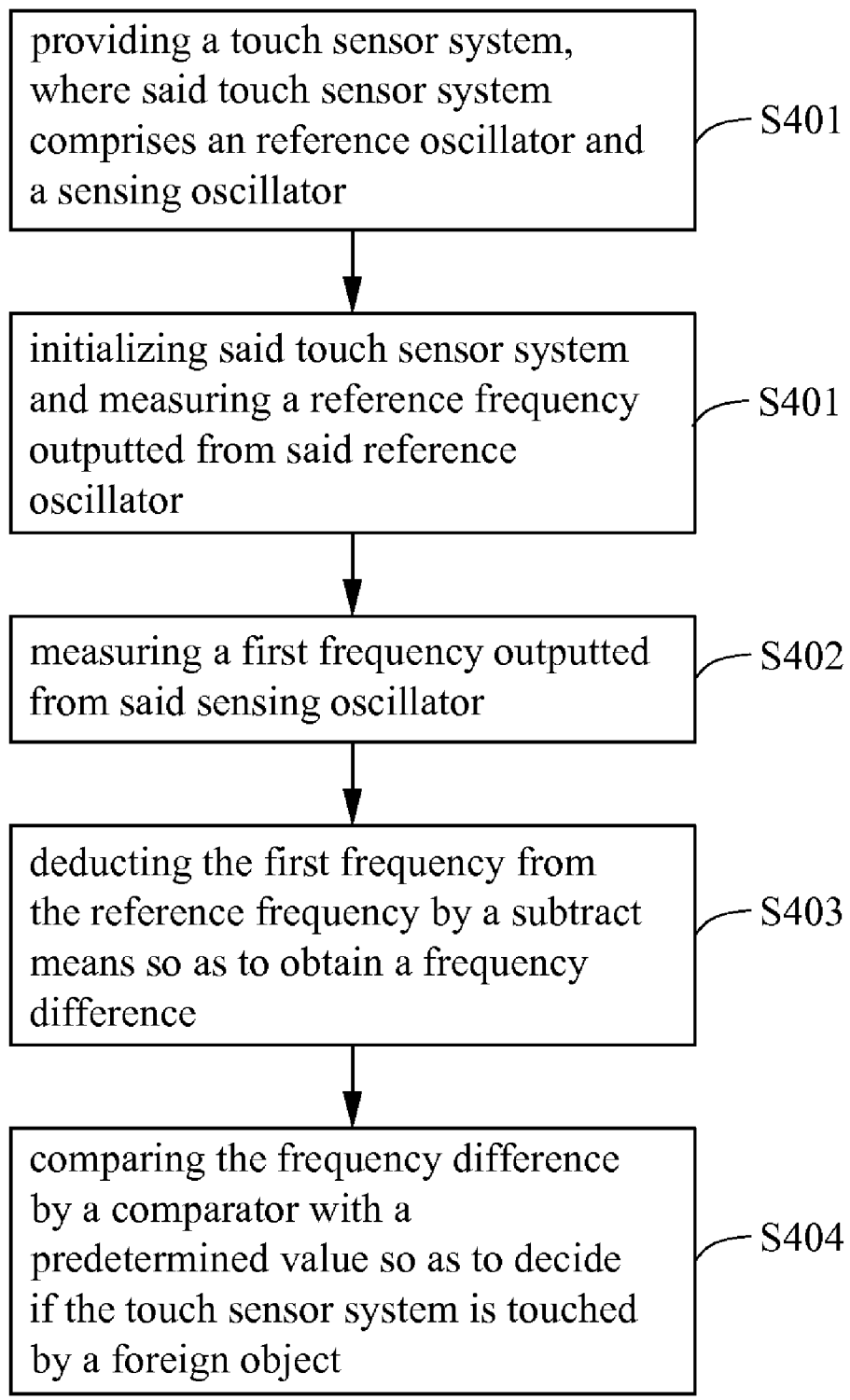
FIG. 4 is another flow chart for another one of the methods disclosed in the present invention.

FIG. 4 illustrates a compensation method, said compensation method comprising steps of: s401a: providing a touch sensor system, where said touch sensor system comprises an reference oscillator and a sensing oscillator; s401: initializing said touch sensor system and measuring a reference frequency outputted from said reference oscillator; s402: measuring a first frequency outputted from said sensing oscillator; s403: deducting the first frequency from the reference frequency by a subtract means so as to obtain a frequency difference; and s404: comparing the frequency difference by a comparator with a predetermined value so as to decide if the touch sensor system is touched by a foreign object.

Preferably, wherein said frequency can be replaced by a period.

Preferably, said method can be applied to eliminating an effect of temperature, humidity, process variation, and an operating voltage of the touch sensor system over the touch sensor system.

Preferably, the sensing oscillator is interconnected to an input pad of the touch sensor system via at least one switch.

Preferably, said method can be done without an operating voltage calibration process.

One skilled in the ordinary art can also understand, based upon the disclosures of the present invention, that to access the reference frequency for the oscillator and to access the external sensing frequency can be done simultaneously or sequentially. And by the same oscillator, the reference frequency and the external sensing frequency (first frequency) can be generated, e.g., one or several switches are installed outside the oscillator, when the switches are all open circuited, a reference frequency thereof can be measured; and when any one of the switches is closed, then the external approaching can be sensed.

While the percentage or trend for the reference frequency vs. external sensing frequency according to the voltage variation is the same, the method disclosed in FIG. 4 can well address the issue of incorrect judgment for the user behavior (for the touch sensor system). However, if the percentage or trend for the reference frequency vs. external sensing frequency according to the voltage variation does not align, the aforesaid incorrect judgment still exists in the touch sensor system for the user, as depicted in FIG. 5.

Figure 5:
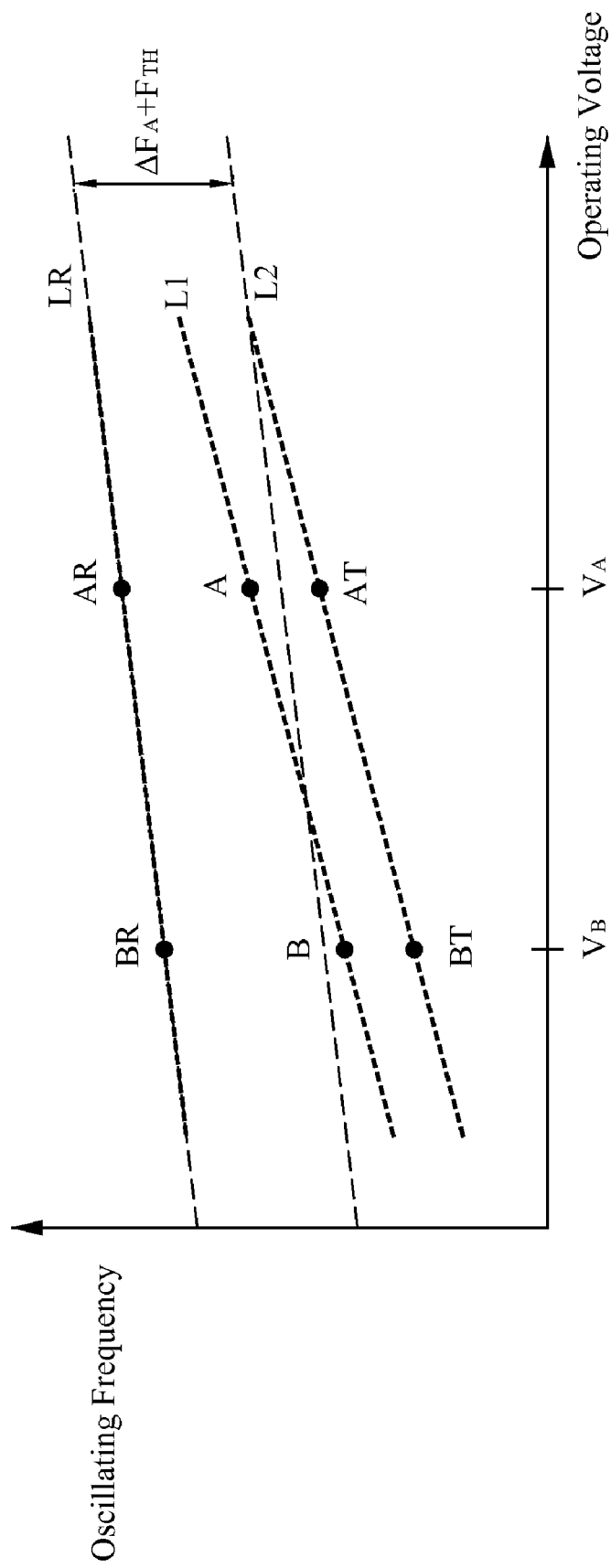
FIG. 5 is a relationship chart for reference oscillator/sensing oscillator versus operating voltage.

In the FIG. 5, which illustrates an automatic calibration for the touch sensor panel, the judge reference is set to be $\Delta F_A + F_{TH}$, at the voltage of $V_A$, the corresponding frequency is $F_{AR}$, and the next target to be detected is the external sensing capacitor. Before the user touches the touch sensor system, the oscillating frequency for the oscillator denotes as $F_A$, then the touch sensor system is using the value of $F_{AR} - F_A$ to judge if the user touches the system. $F_{AR} - F_A$ is denoted as $\Delta F_A$, which is smaller than the judge reference $\Delta F_A + F_{TH}$, hence, the action for the system is treated as not being touched. After the user touches the touch sensor system, the oscillator frequency is $F_{AT}$, meanwhile, $\Delta F_{AT} = F_{AR} - F_{AT}$ is already greater than the judge reference $\Delta F_A + F_{TH}$, hence, it's treated as the system is under way of being touched.

At the voltage of $V_B$, before the user touches the touch sensor system, the reference oscillating frequency of the oscillator appears to drop from $F_{AR}$ to $F_{BR}$, at the same time, the oscillator frequency for the touch sensor system which does not being touched drops from $F_A$ to $F_B$. And, the value of $F_{BR} - F_B$ is being used to judge if the sensor system is touched or not, as depicted in FIG. 5, for which the value of $F_{BR} - F_B$ is already greater than the judge reference point $\Delta F_A + F_{TH}$, hence, the touch sensor system mistakenly treats that there is touch action happening. In the contrary, when the voltage is higher than the point $V_A$, at the case of user is touching the touch sensor system, however, possibly the touch sensor system mistakenly treats there is no touch action.

While the percentage or trend for the reference frequency vs. external sensing frequency according to the voltage variation offsets, the touch sensor system is still likely to judge mistakenly. In view of the oscillator for generating a voltage signal in reference oscillating frequency or sensing oscillating frequency, it is the external impedance to affect the relationship of the frequency vs. voltage. As a result, if the external impedances are the same, then the percentage or trend for the reference frequency vs. external sensing frequency according to the voltage variation approximates the same. In other word, the present invention further relates to a method for impedance automatic matching such that the variation curves for both the reference oscillating frequency and the sensing oscillating frequency appear to be aligned.

Figure 6:
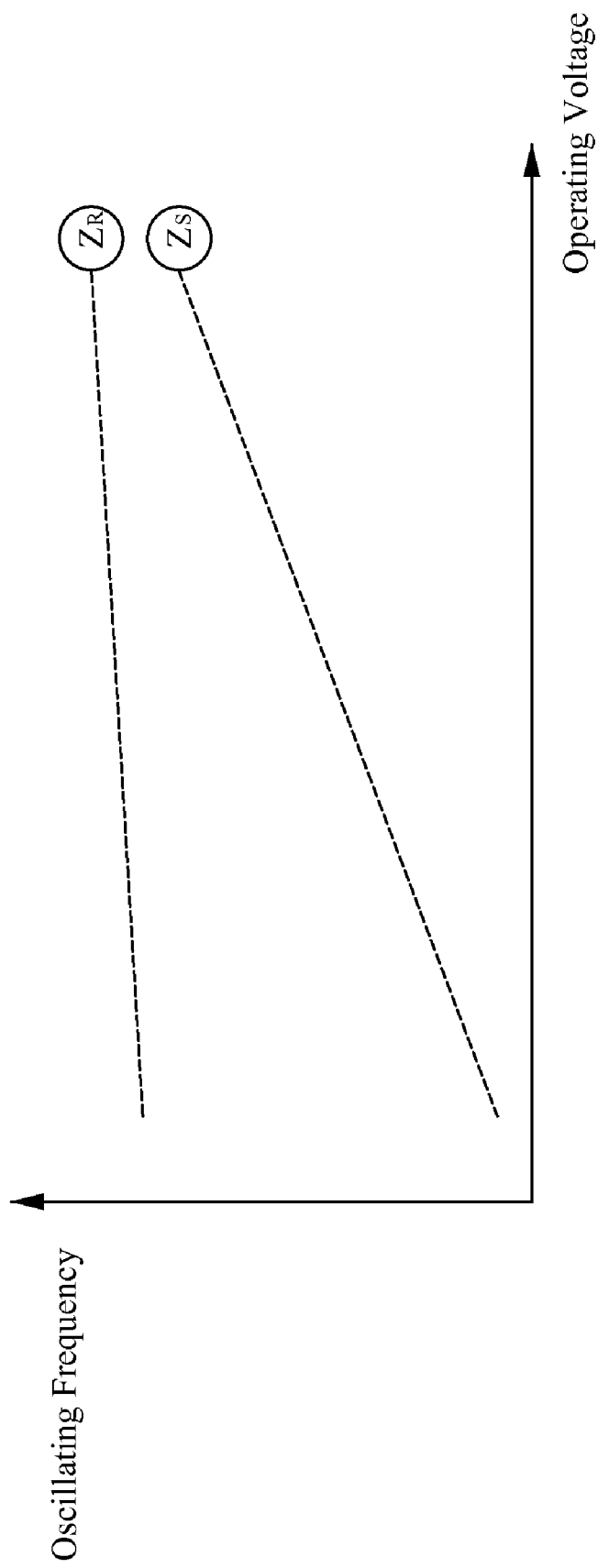
FIG. 6 is another relationship chart for reference oscillator/sensing oscillator versus operating voltage.

FIG. 6 relates to a plot of the reference oscillating frequency/sensing oscillating frequency vs. operating voltage, wherein, $Z_R$ denotes the relationship of the reference oscillating frequency (by the reference oscillator) vs. operating voltage, and $Z_S$ denotes the relationship of the sensing oscillating frequency (by the sensing oscillator) vs. operating voltage. And the reference oscillator and the sensing oscillator can be equivalent to a single oscillator switched by a plurality of switches, or can be individually different ones. Either the sensing oscillator or the reference oscillator, relationship of the generated oscillating frequency vs. operating voltage is related to the connected impedance.

Figure 7:
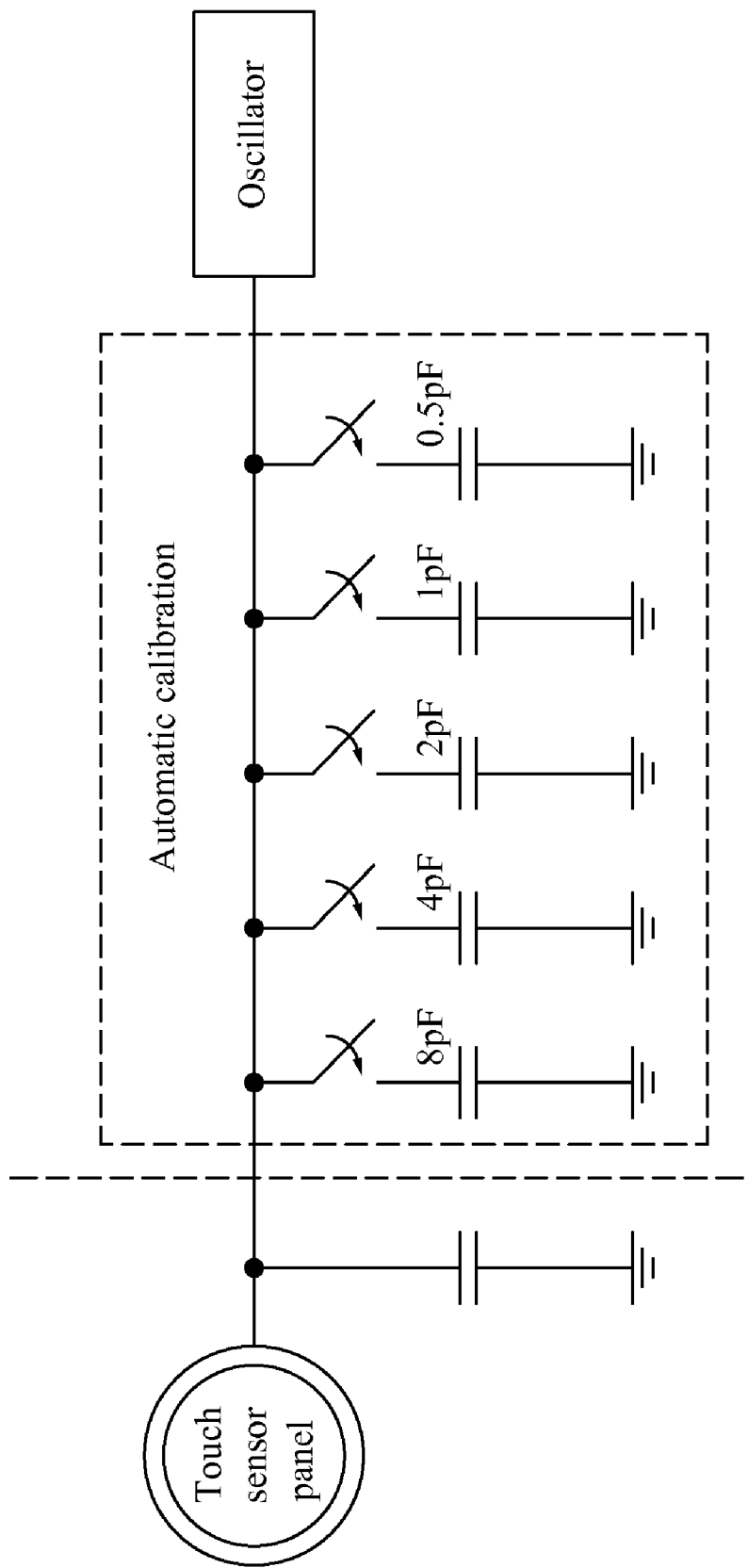
FIG. 7 is a circuit diagram according to the impedance automatic match approach disclosed by the present invention.

Therefore, in one of the preferred embodiments of the present invention, to address the issue of the percentage or trend offset, as FIG. 7 illustrates, the connection between one of the oscillators and the external side is further amended. The dotted frame appears to be the circuit for impedance automatic matching as disclosed in the present invention.

FIG. 7 is further described as follows. At the conjunction side of the oscillator and the exterior components, there should be added a plurality of switches and impedance components. Preferably, in FIG. 7, the aforesaid impedance components are realized by capacitors, but not limited thereto. Before the impedance automatic matching, the varying trend for the oscillator at different impedance should be beforehand measured, which can be known by simulation, experiments, or by observing the frequency variation thereof while connecting the impedance components to the oscillator. After the system initiates, the impedance automatic matching can be processed. Through the "on or off" combination of the plurality of switches, a result for adjusting impedance for the reference oscillating frequency and sensing oscillating frequency to be close to each other can be achieved.

Figure 8:
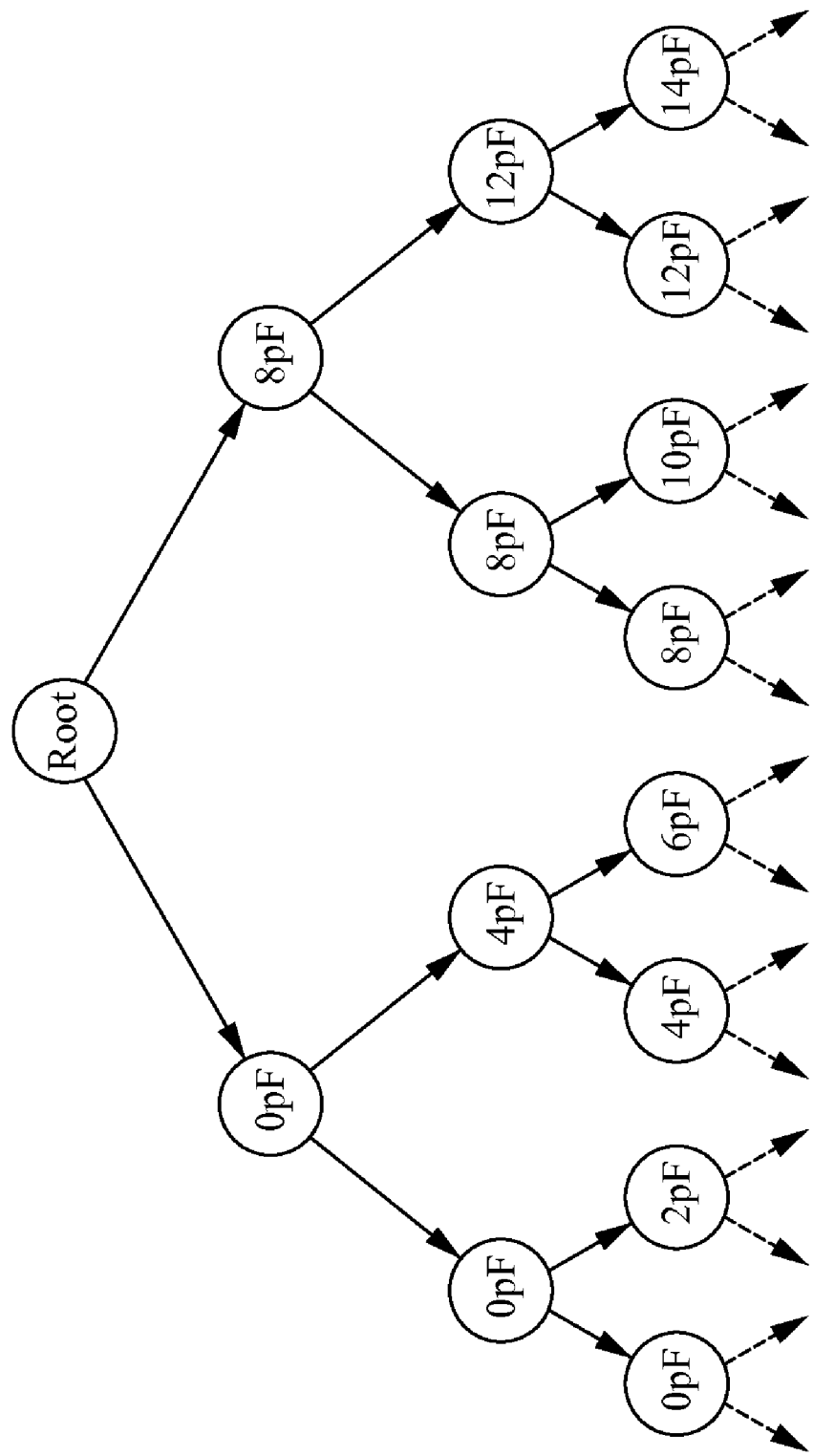
FIG. 8 is a binary search tree for further illustrating the FIG. 7.

FIG. 8 relates to a binary search method for FIG. 7, which can be provided to find an optimal matching value. Suppose the method for impedance automatic matching is realized at the reference oscillator. First, a capacitor of 8 pF is connected and the rest capacitors are disconnected. The speed for the reference oscillating frequency and the sensing oscillating frequency are compared so as to determine if 8 pF should be still connected. And then 8 pF switch status maintain unchanged, again 4 pF capacitor is connected and 2 pF and capacitors under 2 pF are all disconnected and then the speed for the reference oscillating frequency and the sensing oscillating frequency are compared so as to determine if 4 pF should be still connected . . . and so on so forth. Hence, from the largest impedance to the smallest impedance (capacitance), the total automatic impedance matching procedure can be done as FIG. 8 illustrates. In order to serve the purpose of matching the reference oscillating frequency and the sensing oscillating frequency by means of varying the capacitance, hence, we must ensure that the capacitance for sensing oscillator to be greater than that of the reference oscillator, where all of the plurality of switches are open circuited, then the impedance matching can be achieved. Suppose the capacitance at the sensing oscillator side is too big to match, where even all of the aforesaid capacitors are connected, under this situation, the user can by oneself add a set of capacitors such that the automatic matching circuit can function normally. And inside the IC affixed capacitors without switching can be also added and its function is equivalent to the case the user by oneself add capacitors.

While the aforesaid impedance automatic matching circuit is applied to the reference oscillator, in one of the preferred embodiments of the disclosure, different sensing oscillating frequencies can also be matched. Suppose there are 16 sets of sensing oscillating frequencies, since each impedance corresponds a distinct sensing oscillating frequency, hence, matching can be done for distinct sensing oscillating frequencies. Meanwhile, when distinct sensing oscillating frequencies are applied, the switches of the reference oscillator can be automatically controlled so as to approximate the distinct sensing oscillator to the reference oscillator in term of their impedances.

Figure 9:
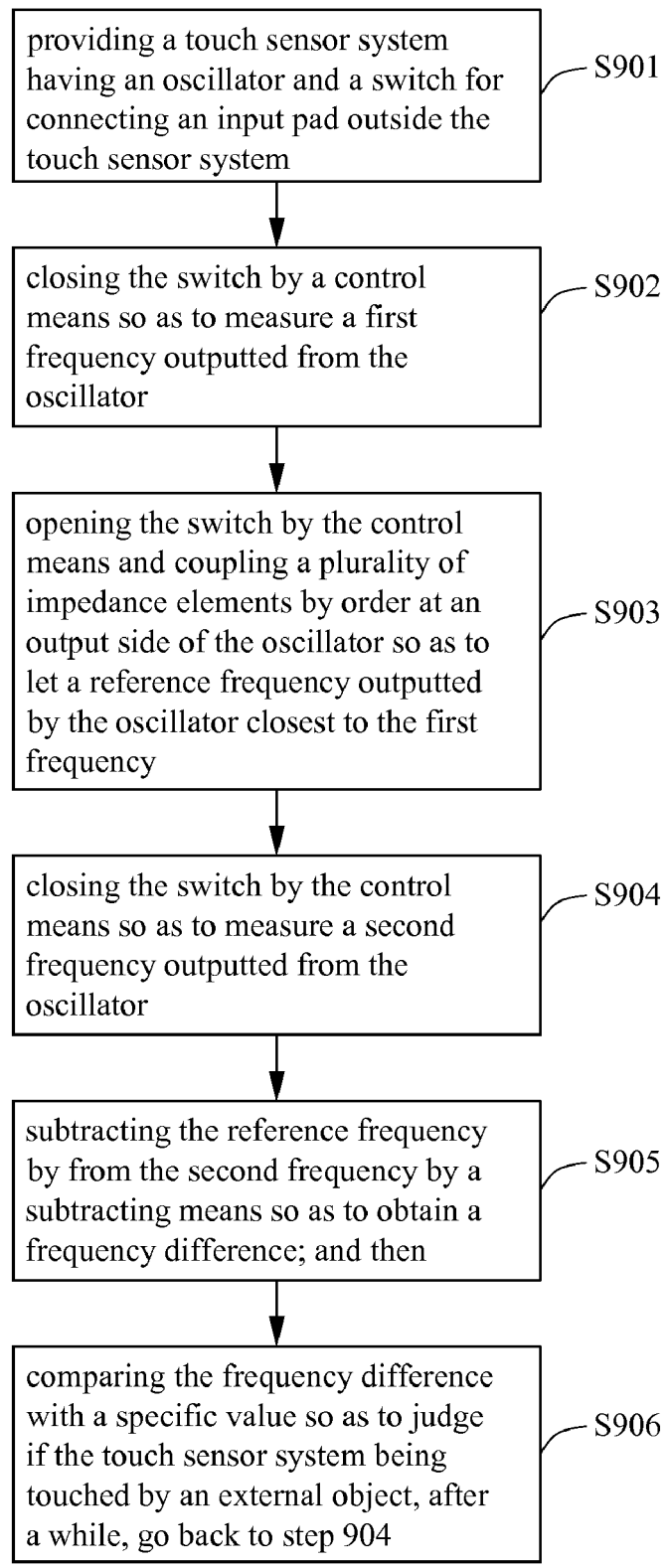
FIG. 9 is a flow chart for the touch sensor system compensation method according to the present invention.

FIG. 9 relates to another embodiments of the present disclosure, which discloses a method of compensating a touch sensor system, comprises the steps of: s901: providing a touch sensor system having an oscillator and a switch for connecting an input pad outside the touch sensor system; s902: closing the switch by a control means so as to measure a first frequency outputted from the oscillator; s903: opening the switch by the control means and coupling a plurality of impedance elements by order at an output side of the oscillator so as to let a reference frequency outputted by the oscillator closest to the first frequency; s904: closing the switch by the control means so as to measure a second frequency outputted from the oscillator; s905: subtracting the reference frequency by from the second frequency by a subtracting means so as to obtain a frequency difference; and then s906: comparing the frequency difference with a specific value so as to judge if the touch sensor system being touched by an external object, after a while, go back to step 904.

Figure 10:
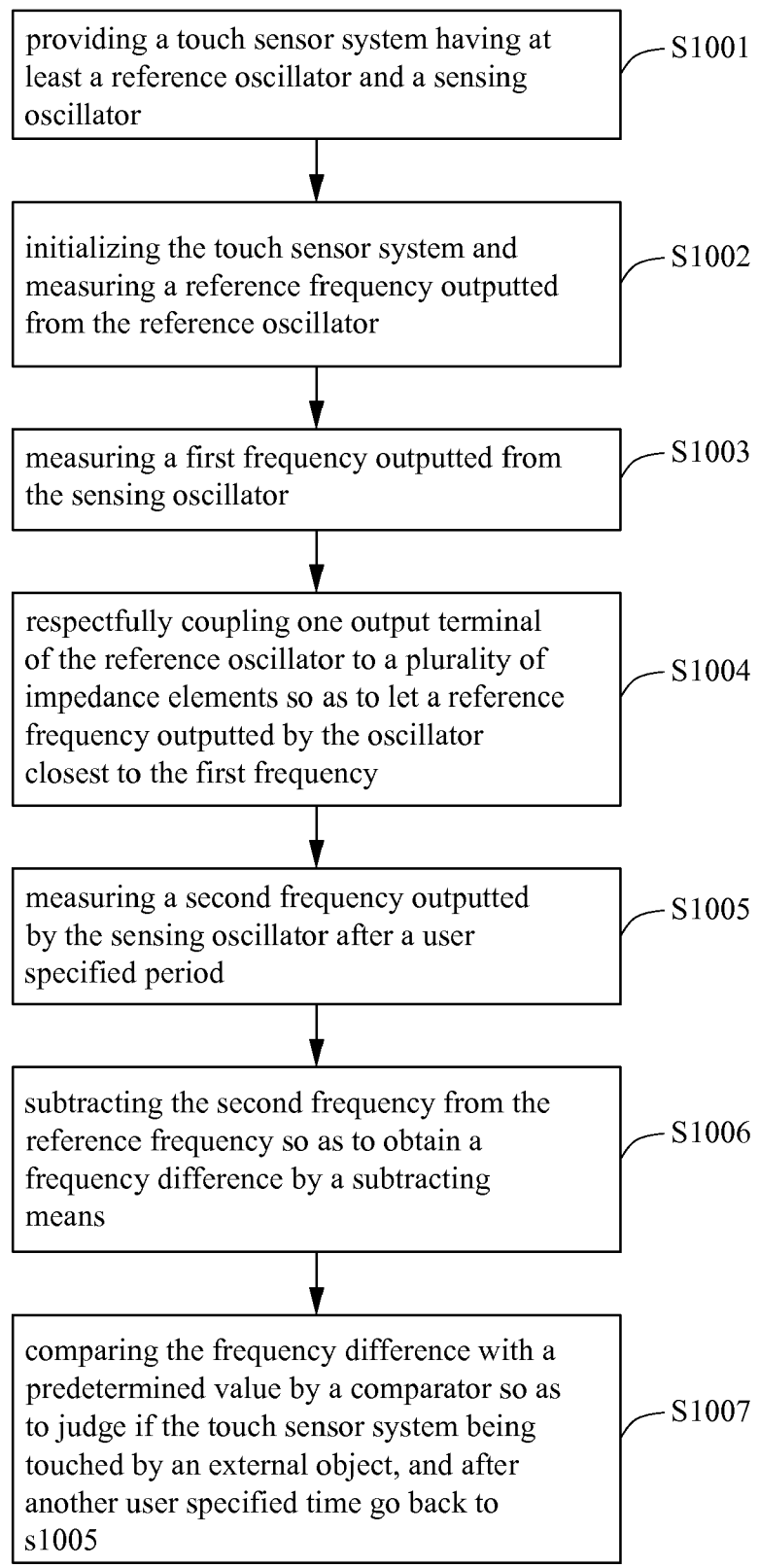
FIG. 10 is another flow chart for the touch sensor system compensation method according to the present invention.

FIG. 10 relates to one embodiment according to the present invention, which illustrates a method for compensating a touch sensor system, comprising the steps of: s1001: providing a touch sensor system having at least a reference oscillator and a sensing oscillator; s1002: initializing the touch sensor system and measuring a reference frequency outputted from the reference oscillator; s1003: measuring a first frequency outputted from the sensing oscillator; s1004: respectfully coupling one output terminal of the reference oscillator to a plurality of impedance elements so as to let a reference frequency outputted by the oscillator closest to the first frequency; s1005: measuring a second frequency outputted by the sensing oscillator after a user specified period; s1006: subtracting the second frequency from the reference frequency so as to obtain a frequency difference by a subtracting means; and then s1007: comparing the frequency difference with a predetermined value by a comparator so as to judge if the touch sensor system being touched by an external object, and after another user specified time go back to s1005.

The aforesaid automatic matching method can also be applicable on the reference oscillator side and on the sensing oscillator side, without departing from the scope of view of the present invention. The present invention can be further applied to a touch sensor system using a reference oscillating frequency and sensing oscillating frequency so as to detect the corresponding touching action, which is readily know by the skilled artisan thus the duplicate information is omitted.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:
1. A compensation method, comprising steps of:
(a) providing a touch sensor system having an oscillator and a switch for connecting an input pad outside the touch sensor system;
(b) closing the switch by a control means so as to measure a first frequency outputted from the oscillator;
(c) opening the switch by the control means and coupling a plurality of impedance elements by order at an output side of the oscillator so as to let a reference frequency outputted by the oscillator closest to the first frequency;
(d) closing the switch so as to measure a second frequency outputted from the oscillator;
(e) subtracting the reference frequency from the second frequency by a subtracting means so as to obtain a frequency difference; and then
(f) comparing the frequency difference with a specific value so as to judge if the touch sensor system being touched by an external object, after a while, go back to (d).

2. The method as recited in claim 1, wherein the plurality of impedance elements further comprises a plurality of resistors, capacitors and inductors.

3. The method as recited in claim 1, wherein the capacitors are determined up to a binary search method.

4. A compensation method, comprising steps of:
(a) providing a touch sensor system having at least a reference oscillator and a sensing oscillator;
(b) initializing the touch sensor system and measuring a reference frequency outputted from the reference oscillator;
(c) measuring a first frequency outputted from the sensing oscillator;
(d) respectfully coupling one output terminal of the reference oscillator to a plurality of impedance elements so as to let a reference frequency outputted by the oscillator closest to the first frequency;
(e) measuring a second frequency outputted by the sensing oscillator after a user specified period;

(f) subtracting the second frequency from the reference frequency by a subtracting means so as to obtain a frequency difference by a subtracting means; and then
(g) comparing the frequency difference with a predetermined value by a comparator so as to judge if the touch sensor system being touched by an external object, and after another user specified time go back to (e).

5. The method as recited in claim 4, wherein the plurality of impedance elements further comprises a plurality of resistors, capacitors and inductors.

6. The method as recited in claim 4, wherein the capacitors are determined up to a binary search method.

* * * * *